US010913120B2

(12) United States Patent
Thiel et al.

(10) Patent No.: US 10,913,120 B2
(45) Date of Patent: Feb. 9, 2021

(54) PROCESS FOR PRODUCTION OF PARTICULATE RUTHENIUM

(71) Applicant: Heraeus Deutschland GmbH & Co. KG, Hanau (DE)

(72) Inventors: Vasco Thiel, Alzenau (DE); Marco Stemmler, Mömbris (DE); Hermann Von Eiff, Neuberg (DE); Christian Kraushaar, Rodenbach (DE); Jan Roder, Freigericht (DE); Christoph Rohlich, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 183 days.

(21) Appl. No.: 16/083,911

(22) PCT Filed: Apr. 18, 2017

(86) PCT No.: PCT/EP2017/059102
§ 371 (c)(1),
(2) Date: Sep. 11, 2018

(87) PCT Pub. No.: WO2017/194269
PCT Pub. Date: Nov. 16, 2017

(65) Prior Publication Data
US 2019/0070666 A1 Mar. 7, 2019

(30) Foreign Application Priority Data
May 13, 2016 (EP) ..................................... 16169646

(51) Int. Cl.
B22F 9/22 (2006.01)
B22F 9/24 (2006.01)
C22B 3/00 (2006.01)
C23C 14/34 (2006.01)
B22F 1/00 (2006.01)
B22F 3/105 (2006.01)

(52) U.S. Cl.
CPC .............. *B22F 9/22* (2013.01); *B22F 1/0011* (2013.01); *B22F 1/0088* (2013.01); *B22F 9/24* (2013.01); *C22B 11/04* (2013.01); *C22B 11/046* (2013.01); *C23C 14/3414* (2013.01); *B22F 3/105* (2013.01); *B22F 2003/1051* (2013.01); *B22F 2201/013* (2013.01); *B22F 2202/13* (2013.01); *B22F 2301/25* (2013.01); *B22F 2998/10* (2013.01); *B22F 2999/00* (2013.01); *Y02P 10/20* (2015.11)

(58) Field of Classification Search
None
See application file for complete search history.

(56) References Cited

U.S. PATENT DOCUMENTS

| 6,036,741 A | 3/2000 | Shindo et al. |
| 2008/0199386 A1* | 8/2008 | Nagai et al. .......... C01G 55/005 423/413 |
| 2014/0373682 A1* | 12/2014 | Lai et al. ................ C22B 11/06 75/631 |

FOREIGN PATENT DOCUMENTS

| DE | 4206156 C1 | 11/1993 |
| EP | 1950178 A2 | 7/2008 |
| EP | 2090669 A2 | 8/2009 |
| EP | 2096084 A1 | 9/2009 |
| EP | 2236633 A1 | 10/2010 |
| JP | H11273454 A | 10/1999 |
| JP | 2000034563 A | 2/2000 |
| JP | 2000178721 A * | 6/2000 |
| JP | 2004111254 A | 4/2004 |
| JP | 2005002395 A | 1/2005 |
| JP | 2007113032 A | 5/2007 |
| WO | WO-2007010897 A1 | 1/2007 |

OTHER PUBLICATIONS

Hurum, Deanna "Laboratory Safety," May 22, 2004, AEESP Environmental Engineering Processes Laboratory Manual, p. 2 (Year: 2004).*

* cited by examiner

Primary Examiner — Anthony J Zimmer
Assistant Examiner — Dean Mazzola
(74) Attorney, Agent, or Firm — Blank Rome LLP

(57) ABSTRACT

Process for the production of particulate ruthenium with a purity of ≤99.99 wt. % and a specific surface area of 0.2-0.5 $m^2/g$, comprising: (1) providing a hydrochloric solution prepared by dissolving $RuO_4$ in hydrochloric acid and has a content of ruthenium in the form of dissolved ruthenium species of 15-22 wt. %; (2) providing an aqueous solution with an ammonium chloride content of 200-600 g/litre; (3) forming a reaction mixture by dosing the hydrochloric solution provided in step (1) to the aqueous solution provided in step (2) at a molar ratio of 1 mol ruthenium: 3-6 mol ammonium chloride, at a temperature of 55-90° C. over the course of 0.2-5 hours and while adjusting and maintaining a pH of −0.6 to 0; (4) separating solid material formed during step (3) from the hydrochloric reaction mixture; and (5) calcinating the solid material separated in step (4) at an object temperature of 350-1,000° C.

11 Claims, No Drawings

PROCESS FOR PRODUCTION OF PARTICULATE RUTHENIUM

This application is a national stage of International Patent Application No. PCT/EP2017/059102, filed Apr. 18, 2017, which claims the benefit of European Patent Application No. 16169646.3, filed May 13, 2016, each of which are hereby incorporated by reference in their entirety.

The present invention relates to a process for the production of particulate ruthenium.

The production of ruthenium by calcination of ammoniumchlororuthenate compounds is known, for example from EP 2 090 669 A2, EP 2 096 084 A1, EP 2 236 633 A1, and DE 42 06 156 C1. Examples of reaction equations that can describe the ruthenium production process include:

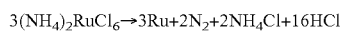

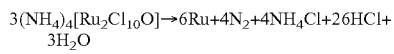

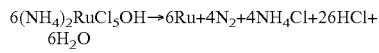

It has been evident to the applicant that particulate ruthenium with a purity of ≥99.99 wt. % and a specific surface area of 0.2 to 0.5 m²/g is particularly well-suited for the production of ruthenium targets, in particular according to the spark plasma sintering process. Moreover, the applicant found a process by means of which said particulate ruthenium can be produced.

Accordingly, the invention relates both to particulate ruthenium with a purity of ≥99.99 wt. % and a specific surface area of 0.2 to 0.5 m²/g, preferably 0.22 to 0.35 m²/g, and a process for the production of said particulate ruthenium. The method comprises the steps of:
(1) providing a hydrochloric solution that was prepared by dissolving $RuO_4$ in hydrochloric acid and has a content of ruthenium in the form of dissolved ruthenium species in the range of 15 to 22 wt. %;
(2) providing an aqueous solution with an ammonium chloride content in the range of 200 to 600 g/litre, preferably 200 to 500 g/litre, in particular 200 to 400 g/litre;
(3) forming a reaction mixture by dosing the hydrochloric solution provided in step (1) to the aqueous solution provided in step (2) at a molar ratio of 1 mol ruthenium:3 to 6 mol ammonium chloride, preferably of 1 mol ruthenium:4.5 to 6 mol ammonium chloride, at a temperature of 55 to 90° C., preferably 65 to 85° C., over the course of 0.2 to 5 hours, preferably 1 to 5 hours, in particular 1 to 3 hours, and while adjusting and maintaining a pH value in the range of −0.6 to 0;
(4) separating solid material formed during step (3) from the hydrochloric reaction mixture; and
(5) calcinating the solid material separated in step (4) at an object temperature in the range of 350 to 1,000° C., preferably 450 to 900° C.

The term "specific surface area" is used herein. The specific surface area in m²/g can be determined by means of BET measurement in accordance with DIN ISO 9277: 2014-01 (in accordance with chapter 6.3.1, statistical-volumetric measuring procedure, gas used: nitrogen).

In step (1) of the process according to the invention, a hydrochloric solution that was provided by dissolving $RuO_4$ in hydrochloric acid and has a content of ruthenium in the form of dissolved ruthenium species in the range of 15 to 22 wt. % is provided. Examples of dissolved ruthenium species to be mentioned in this context include, in particular, ruthenium chloride and hexachlororuthenic acid. The procedure for dissolving $RuO_4$ in hydrochloric acid is known to a person skilled in the art, for example from EP 2 090 669 A2, EP 2 096 084 A1, and EP 2 236 633 A1. Expediently, 5 to 12 molar hydrochloric acid is used for dissolving the $RuO_4$.

The hydrochloric solution provided in step (1) can have a pH value in the range of, for example, −0.9 to −0.7.

In step (2) of the process according to the invention, an aqueous solution with an ammonium chloride content in the range of 200 to 600 g/litre, preferably 200 to 500 g/litre, in particular 200 to 400 g/litre, is provided. In particular, this concerns an aqueous solution of ammonium chloride, specifically a solution of ammonium chloride in water without other substances being added to or being present in the aqueous solution. The production of said aqueous solution is no difficulty to a person skilled in the art such that no further explanation is required.

In step (3) of the process according to the invention, a reaction mixture is formed by dosing the hydrochloric solution provided in step (1) to the aqueous solution provided in step (2) at a molar ratio of 1 mol ruthenium:3 to 6 mol ammonium chloride, preferably of 1 mol ruthenium:4.5 to 6 mol ammonium chloride, at a temperature of 55 to 90° C., preferably 65 to 85° C., over the course of 0.2 to 5 hours, preferably 1 to 5 hours, in particular 1 to 3 hours, and while adjusting and maintaining a pH value of the reaction mixture in the range of −0.6 to 0.

The solutions provided in steps (1) and (2) are combined into a reaction mixture in step (3) by dosing the solution provided in step (1) to the solution provided in step (2) and not vice versa. It is expedient to stir during the dosing.

The dosing takes place at a molar ratio of 1 mol ruthenium:3 to 6 mol ammonium chloride, preferably of 1 mol ruthenium:4.5 to 6 mol ammonium chloride, i.e. the solutions provided in steps (1) and (2) are combined at a ratio of 1 mol ruthenium:3 to 6 mol ammonium chloride, preferably at a ratio of 1 mol ruthenium:4.5 to 6 mol ammonium chloride to form the reaction mixture.

During step (3) the temperature is adjusted to and maintained in the range of 55 to 90° C., preferably 65 to 85° C. In other words, the temperature of the reaction mixture is adjusted to and maintained in the range of 55 to 90° C., preferably 65 to 85° C., from the beginning until the end of the dosing of the solution provided in step (1) to the solution provided in step (2).

During step (3), a pH value of the reaction mixture is adjusted to and maintained in the range of −0.6 to 0. At the beginning of the dosing, the pH of the resulting reaction mixture usually is higher than 0 and then drops rapidly upon progressive dosing of the hydrochloric solution provided in step (1). However, the pH value can just as well be adjusted with hydrochloric acid to a pH value in the range of −0.6 to 0 before starting the dosing. During the dosing, the adjustment and maintenance of the pH value in the range of −0.6 to 0 can be supported by adding a corresponding amount of suitably concentrated hydrochloric acid.

The dosing in step (3) takes place over the course of 0.2 to 5 hours, preferably 1 to 5 hours, in particular 1 to 3 hours.

A solid material precipitates from the hydrochloric reaction mixture during step (3).

It can be expedient to continue stirring the reaction mixture thus produced after completion of the dosing, for example for a period of 30 to 60 minutes.

In step (4) of the process according to the invention, the solid material formed from the hydrochloric reaction mixture in step (3) is separated. Conventional solid-liquid separation procedures known to a person skilled in the art can be used in this context, for example decanting, lifting, filtration or suitable combinations of said separation procedures.

In step (5) of the process according to the invention, the solid material separated in step (4) is calcinated at an object temperature (temperature of the material to be calcinated) of 350 to 1,000° C., in particular 450 to 900° C., for example for a period of at least 1.5 hours, in particular 1.5 to 7 hours.

The calcination can take place on air, in an inert gas atmosphere, for example in nitrogen and/or argon, or in a reducing atmosphere, for example in nitrogen/hydrogen at a volume ratio of 90:10 to 95:5.

Expediently, the gaseous decomposition products of the calcination process are removed from the calcinating furnace by means of a gas flow (flow of said air, inert gas or reducing gas mixture).

The metallic ruthenium stays behind in particulate form having a specific surface area of 0.2 to 0.5 m$^2$/g, preferably of 0.22 to 0.35 m$^2$/g.

The purity of the ruthenium thus obtained can be ≥99.99 wt. %; this will usually be the case, in particular, if the calcination took place while excluding the entry of air, i.e. in an inert gas atmosphere or in a reducing atmosphere.

It can be expedient, in particular if the calcination according to step (5) took place on air, i.e. while atmospheric oxygen entered, but in other cases as well to perform a step (6) in the form of a reducing treatment of the particulate ruthenium thus obtained, which is common to a person skilled in the art. The purity can thus be made to be, for example, ≥99.99 wt. %. A suitable reducing treatment is, for example, a treatment with hydrogen at elevated temperatures in the range of, for example, 120 to 900° C. The optional step (6) usually has no influence on the specific surface area of the particulate ruthenium obtained after completion of step (5).

The mean particle diameter d50 of the particulate ruthenium obtained after completion of step (5) or (6), or, more specifically, the mean particle diameter d50 of the primary particles of particulate ruthenium can be in the range of, for example, 5 to 50 μm. The d50 value can be determined by means of laser diffractometry, for example using a laser granulometer (e.g. CILAS 920 made by Quantachrome, Odelzhausen, Germany).

EXAMPLES

The process according to the invention comprising steps (1) to (5) has been implemented repeatedly in the laboratory while varying various parameters. Moreover, reference experiments outside the scope of the invention have been performed.

Based on the material produced according to example 1 of EP 2 236 633 A1, step (1) of the process was implemented according to the example disclosed in sections [18]-[27] of EP 2 096 084 A1. The ruthenium content was varied.

In step (2), aqueous ammonium chloride solutions of various concentrations were prepared.

In each case, step (3) involved a molar ratio of 1:5.4 of ruthenium:ammonium chloride and a sample size of 150 to 400 mL. The pH value and the temperature of the reaction mixture as well as the dosing duration of the solution provided in step (1) were varied.

In step (5), the calcination was performed for 2 hours at an object temperature of 800° C. in a nitrogen flow.

In each case, particulate ruthenium with a purity of ≥99.99 wt. % and a mean particle diameter d50 in the range of 15 to 45 μm was obtained.

The following table shows the parameters used in the various examples (1-18 according to the invention, 19-21 reference) and the specific surface area as determined for the particulate ruthenium obtained using the aforementioned process.

| Example | Ru content (wt. %) | NH$_4$Cl content (g/L) | pH | T (° C.) | Dosing duration (h) | BET (m$^2$/g) |
|---|---|---|---|---|---|---|
| 1 | 15 | 200 | −0.6 | 55 | 0.2 | 0.41 |
| 2 | 22 | 600 | 0 | 55 | 3 | 0.27 |
| 3 | 15 | 200 | −0.6 | 90 | 3 | 0.27 |
| 4 | 15 | 600 | −0.6 | 90 | 0.2 | 0.40 |
| 5 | 22 | 200 | 0 | 55 | 0.2 | 0.44 |
| 6 | 22 | 200 | −0.6 | 55 | 3 | 0.43 |
| 7 | 22 | 600 | −0.6 | 55 | 0.2 | 0.33 |
| 8 | 15 | 200 | 0 | 55 | 3 | 0.30 |
| 9 | 15 | 200 | 0 | 90 | 0.2 | 0.32 |
| 10 | 22 | 600 | 0 | 90 | 0.2 | 0.43 |
| 11 | 22 | 200 | −0.6 | 90 | 0.2 | 0.43 |
| 12 | 15 | 600 | −0.6 | 55 | 3 | 0.23 |
| 13 | 18.5 | 400 | −0.2 | 72.5 | 1.6 | 0.33 |
| 14 | 15 | 600 | 0 | 55 | 0.2 | 0.23 |
| 15 | 22 | 200 | 0 | 90 | 3 | 0.27 |
| 16 | 22 | 600 | −0.6 | 90 | 3 | 0.44 |
| 17 | 18.5 | 400 | −0.2 | 72.5 | 1.6 | 0.28 |
| 18 | 15 | 600 | 0 | 90 | 3 | 0.28 |
| 19 (ref.) | 25 | 190 | −0.6 | 50 | 0.2 | 0.61 |
| 20 (ref.) | 12 | 180 | 0 | 90 | 3 | 0.18 |
| 21 (ref.) | 15 | 600 | 0.3 | 55 | 4 | 0.16 |

The invention claimed is:

1. A process for the production of particulate ruthenium with a purity of ≥99.99 wt. % and a specific surface area of 0.2 to 0.5 m$^2$/g, comprising the steps of:
   (1) providing a hydrochloric solution prepared by dissolving RuO$_4$ in hydrochloric acid, the hydrochloric solution having a content of ruthenium in the form of dissolved ruthenium species in the range of 15 to 22 wt. %;
   (2) providing an aqueous solution with an ammonium chloride content in the range of 200 to 600 g/litre;
   (3) forming a reaction mixture by dosing the hydrochloric solution provided in step (1) to the aqueous solution provided in step (2) at a molar ratio of 1 mol ruthenium:3 to 6 mol ammonium chloride, at a temperature of 55 to 90° C. over the course of 0.2 to 5 hours and while adjusting and maintaining a pH value in the range of −0.6 to 0;
   (4) separating solid material formed during step (3) from the hydrochloric reaction mixture; and
   (5) calcinating the solid material separated in step (4) at an object temperature in the range of 350 to 1,000° C.

2. The process of claim 1, whereby the hydrochloric solution provided in step (1) has a pH value in the range of −0.9 to −0.7.

3. The process of claim 1, whereby the aqueous solution provided in step (2) consists of ammonium chloride and water.

4. The process of claim 1, whereby the temperature in step (3) is 65 to 85° C.

5. The process of claim 1, whereby the dosing duration in step (3) is 1 to 5 hours.

6. The process of claim 1, whereby the molar ratio is 1 mol ruthenium:4.5 to 6 mol ammonium chloride.

7. The process of claim 1, whereby the calcination takes place at an object temperature of 450 to 900° C.

8. The process of claim 1, whereby the duration of calcination is 1.5 to 7 hours.

9. The process of claim 1, whereby the calcination takes place on air, in an inert gas atmosphere or in a reducing atmosphere.

10. The process of claim 1, comprising a step (6), in which the particulate ruthenium thus obtained is subjected to a reducing treatment.

11. The process of claim 10, whereby the reducing treatment consists of a treatment with hydrogen at temperatures in the range of 120 to 900° C.

\* \* \* \* \*